US011449160B2

(12) United States Patent
Nam et al.

(10) Patent No.: US 11,449,160 B2
(45) Date of Patent: Sep. 20, 2022

(54) INPUT SENSING UNIT, DISPLAY DEVICE INCLUDING SAME, AND METHOD FOR MANUFACTURING SAME

(71) Applicant: Samsung Display Co., Ltd., Yongin-si (KR)

(72) Inventors: Youngeun Nam, Suncheon-si (KR); JongWon Moon, Cheonan-si (KR); Hyeaweon Shin, Seongnam-si (KR); Cheolhwan Eom, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 212 days.

(21) Appl. No.: 16/848,740

(22) Filed: Apr. 14, 2020

(65) Prior Publication Data
US 2020/0363882 A1 Nov. 19, 2020

(30) Foreign Application Priority Data

May 13, 2019 (KR) .......................... 10-2019-0055747

(51) Int. Cl.
G06F 3/041 (2006.01)
H05K 1/14 (2006.01)
H05K 3/36 (2006.01)
H05K 1/02 (2006.01)

(52) U.S. Cl.
CPC ............ *G06F 3/041* (2013.01); *H05K 1/0281* (2013.01); *H05K 1/147* (2013.01); *H05K 3/361* (2013.01); *G06F 2203/04102* (2013.01); *G06F 2203/04107* (2013.01); *H05K 2201/056* (2013.01);

(Continued)

(58) Field of Classification Search
CPC .......... G06F 3/041; G06F 2203/04102; G06F 2203/04107; G06F 3/0412; G06F 3/0416; G06F 2203/04103; H05K 1/0281; H05K 1/147; H05K 3/361; H05K 2201/056; H05K 2201/10128; H05K 2201/10151; H05K 2201/2009; H05K 1/189; G09G 3/20
See application file for complete search history.

(56) References Cited

U.S. PATENT DOCUMENTS 9,287,329 B1 * 3/2016 Lee ..................... H01L 27/1218
9,425,418 B2 * 8/2016 Kwon ................. H01L 27/3276
10,568,218 B1 * 2/2020 Xu ........................ H05K 5/0017
(Continued)

FOREIGN PATENT DOCUMENTS

KR 10-2006-0053751 A 5/2006
KR 10-2008-0105543 A 12/2008
(Continued)

*Primary Examiner* — Grant Sitta
(74) *Attorney, Agent, or Firm* — Lewis Roca Rothgerber Christie LLP

(57) ABSTRACT

An input sensing device includes an input sensing panel, a flexible circuit board connected to a first side of the input sensing panel, a first lower protective film below the input sensing panel, a second lower protective film below the first lower protective film, and a reinforcing member between a lower portion of the flexible circuit board and a second side of the input sensing panel that is adjacent to the first side, the reinforcing member covering a portion of the lower portion of the flexible circuit board. A side facing the reinforcing member of any one of the first lower protective film and the second lower protective film is spaced from the reinforcing member.

20 Claims, 13 Drawing Sheets

(52) U.S. Cl.
CPC .............. *H05K 2201/10128* (2013.01); *H05K 2201/10151* (2013.01); *H05K 2201/2009* (2013.01)

(56) References Cited

U.S. PATENT DOCUMENTS

| | | | | |
|---|---|---|---|---|
| 10,637,007 | B1* | 4/2020 | Wang | H01L 51/0097 |
| 10,693,089 | B2* | 6/2020 | He | H01L 51/0097 |
| 10,707,194 | B2* | 7/2020 | Odaka | H01L 51/0097 |
| 10,748,980 | B2* | 8/2020 | Cho | H01L 23/5283 |
| 10,802,629 | B2* | 10/2020 | Jeon | G06F 3/0416 |
| 10,816,713 | B2* | 10/2020 | Miyazaki | F21V 29/85 |
| 10,866,444 | B2* | 12/2020 | You | H01L 51/0097 |
| 10,892,312 | B2* | 1/2021 | Won | H01L 51/56 |
| 10,896,948 | B2* | 1/2021 | Lee | H01L 27/3276 |
| 11,036,071 | B2* | 6/2021 | Um | G02F 1/133305 |
| 11,183,653 | B2* | 11/2021 | Lee | H01L 27/3248 |
| 11,216,131 | B2* | 1/2022 | Choi | G02F 1/13338 |
| 11,284,547 | B2* | 3/2022 | Shin | H05K 7/20963 |
| 2014/0217382 | A1* | 8/2014 | Kwon | H01L 51/5246 257/40 |
| 2015/0036300 | A1* | 2/2015 | Park | H05K 1/147 156/212 |
| 2016/0043337 | A1* | 2/2016 | Namkung | H01L 27/3244 257/88 |
| 2016/0084994 | A1* | 3/2016 | Namkung | H01L 51/5253 359/488.01 |
| 2016/0291404 | A1* | 10/2016 | Kim | G02F 1/133528 |
| 2017/0047547 | A1* | 2/2017 | Son | H01L 51/5253 |
| 2017/0176835 | A1* | 6/2017 | Gupta | G02F 1/133615 |
| 2017/0271616 | A1* | 9/2017 | Choi | H01L 51/0097 |
| 2018/0076412 | A1* | 3/2018 | Kim | H04M 1/0266 |
| 2018/0151641 | A1* | 5/2018 | Choo | H01L 27/323 |
| 2019/0278411 | A1* | 9/2019 | Jeon | G02B 5/3025 |
| 2021/0159221 | A1* | 5/2021 | Li | G06F 1/1601 |

FOREIGN PATENT DOCUMENTS

| | | |
|---|---|---|
| KR | 10-2014-0118676 A | 10/2014 |
| KR | 10-1931481 B1 | 12/2018 |

* cited by examiner

INPUT SENSING UNIT, DISPLAY DEVICE INCLUDING SAME, AND METHOD FOR MANUFACTURING SAME

CROSS-REFERENCE TO RELATED APPLICATION

This application claims priority to and the benefit of Korean Patent Application No. 10-2019-0055747, filed on May 13, 2019, the entire contents of which are hereby incorporated by reference.

BACKGROUND

The present disclosure herein relates to a display device, and more particularly, to a display device including an input sensing unit (e.g., an input sensor or an input sensing device).

Multimedia electronic devices, such as a television, a mobile phone, a tablet computer, a navigation system, a game console, and the like, for example, include a display device for displaying an image. These display devices may include a display module for displaying an image, and an input sensing unit (e.g., an input sensor or input sensing device) to enable a touch-based input method to allow users to input information or commands intuitively and conveniently, in addition to other input methods, such as a button, a keyboard, and a mouse.

Generally, the input sensing unit includes an input sensing panel in which a plurality of input electrodes are disposed, and a driving integrated circuit (IC) connected to one side of the input sensing panel to drive the input electrodes. The driving integrated circuit generates driving signals and provides the signals to the input electrodes. The input electrodes may provide the input information corresponding to the input of the users to the drive integrated circuit.

The driving integrated circuit is mounted on a flexible printed circuit board (FPCB), and one side of the flexible printed circuit board is connected to one side of the input sensing panel. The driving integrated circuit is connected to the input electrodes of the input sensing panel through the flexible printed circuit board. Such a connection method is defined as a chip on film (COF) method.

Recently, there is a demand for a technique capable of reducing a dead space, which refers to a portion in which an image is not displayed, of a display device. One method for reducing the dead space is to position the driving integrated circuit underneath the display panel by bending (or folding) a portion of the flexible printed circuit board. However, when bending a portion of the flexible printed circuit board, cracks may occur in wirings (or wires) disposed at (e.g., in or on) the bending area.

The above information disclosed in this Background section is for enhancement of understanding of the background of the present invention, and therefore, it may contain information that does not constitute prior art.

SUMMARY

One or more example embodiments of the present disclosure relate to an input sensing unit (e.g., an input sensor or an input sensing device) in which a bending area may be reinforced, and a display device including the same.

One or more example embodiments of the present disclosure relate to a method for manufacturing an input sensing unit (e.g., an input sensor or an input sensing device) in which a bending area may be reinforced.

According to an example embodiment of the present invention, an input sensing device includes: an input sensing panel including a plurality of sensing electrodes; a flexible circuit board connected to a first side of the input sensing panel; a first lower protective film below the input sensing panel; a second lower protective film below the first lower protective film; and a reinforcing member between a lower portion of the flexible circuit board and a second side of the input sensing panel that is adjacent to the first side, the reinforcing member covering a portion of the lower portion of the flexible circuit board. A side facing the reinforcing member of any one of the first lower protective film and the second lower protective film is spaced from the reinforcing member.

In an example embodiment, a length of the second lower protective film in a direction parallel to a touch sensing surface of the input sensing panel may be shorter than a length of the first lower protective film in the direction, and the side facing the reinforcing member of the second lower protective film may be spaced from the reinforcing member.

In an example embodiment, a thickness of the first lower protective film may be less than a thickness of the second lower protective film in a direction perpendicular to a touch sensing surface of the input sensing panel.

In an example embodiment, a thickness of the reinforcing member at the second side of the input sensing panel may correspond to a sum of a thickness of the flexible circuit board and the thickness of the first lower protective film.

In an example embodiment, a maximum thickness of the reinforcing member in the direction may be 90 µm or less.

In an example embodiment, a thickness of the reinforcing member may decrease as a distance from the second side of the input sensing panel increases.

In an example embodiment, each of the first lower protective film and the second lower protective film may include a peelable film.

In an example embodiment, the first lower protective film may include a pull tab extending from a side of the first lower protective film.

In an example embodiment, a thickness of the first lower protective film may be greater than a thickness of the second lower protective film in a direction perpendicular to a touch sensing surface of the input sensing panel.

In an example embodiment, a length of the first lower protective film in a direction parallel to a touch sensing surface of the input sensing panel may be shorter than a length of the second lower protective film in the direction, and the side facing the reinforcing member of the first lower protective film may be spaced from the reinforcing member.

In an example embodiment, the reinforcing member at the second side of the input sensing panel may include a portion that is between the input sensing panel and the second lower protective film to overlap with a portion of the second lower protective film.

In an example embodiment, the input sensing device may further include an upper protective film on the input sensing panel.

According to an example embodiment of the present invention, a display device includes: a display panel including a plurality of pixels; a protective member on the display panel; an input sensing panel on an upper surface of the display panel and including a plurality of sensing electrodes; an adhesive member between the display panel and the input sensing panel, the adhesive member connecting the input sensing panel to the display panel; a flexible circuit board connected to a first side of the input sensing panel; and a reinforcing member between a lower portion of the flexible circuit board and a second side of the input sensing panel that is adjacent to the first side, the reinforcing member covering a portion of the lower portion of the flexible circuit board. The reinforcing member is spaced from the protective member.

In an example embodiment, the reinforcing member may be further located at one side of the adhesive member that is adjacent to the second side of the input sensing panel.

In an example embodiment, a thickness of the reinforcing member may decrease as a distance from the second side of the input sensing panel increases.

In an example embodiment, one side of the reinforcing member may be on the input sensing panel and the adhesive member to cover a lower end of the second side of the input sensing panel.

In an example embodiment, the display device may further include: a main circuit board; and a panel flexible circuit board connected to one side of the display panel, the panel flexible circuit board electrically connecting the main circuit board to the display panel, wherein the flexible circuit board may be electrically connected to the main circuit board.

According to an example embodiment, a method for manufacturing an input sensing device, includes: connecting a flexible circuit board to a first side of an input sensing panel including a plurality of sensing electrodes; placing a first lower protective film below the input sensing panel, and a second lower protective film below the first lower protective film; and placing a reinforcing member between a lower portion of the flexible circuit board and a second side of the input sensing panel that is adjacent to the first side, the reinforcing member covering a portion of the lower portion of the flexible circuit board. A side facing the reinforcing member of any one of the first lower protective film and the second lower protective film is spaced from the reinforcing member.

In an example embodiment, a length of the second lower protective film in a direction parallel to a touch sensing surface of the input sensing panel may be shorter than a length of the first lower protective film in the direction, and the side facing the reinforcing member of the second lower protective film may be spaced from the reinforcing member.

In an example embodiment, a thickness of the first lower protective film may be less than a thickness of the second lower protective film in a direction perpendicular to a touch sensing surface of the input sensing panel.

BRIEF DESCRIPTION OF THE FIGURES

The above and other aspects and features of the present invention will become more apparent to those skilled in the art from the following detailed description of the example embodiments with reference to the accompanying drawings. In the drawings.

DETAILED DESCRIPTION

Figure 1:
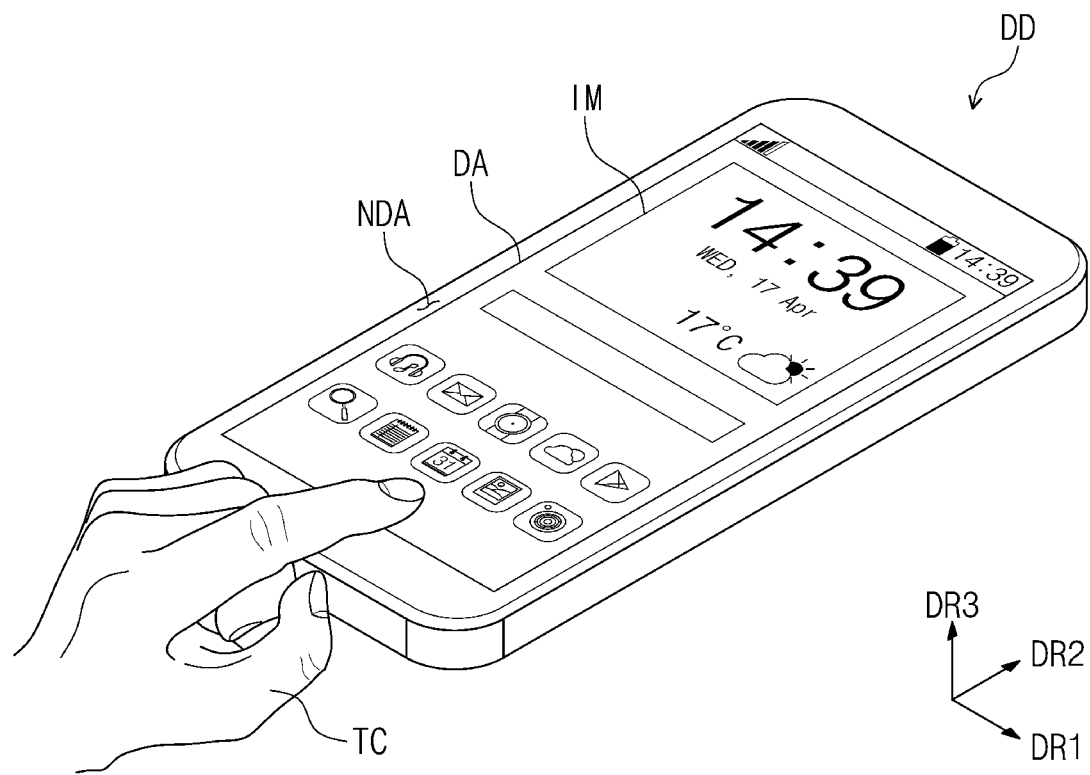
FIG. 1 is a perspective view of a portable terminal including a display device according to an example embodiment of the present invention.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present The terminology used herein is for the purpose of describing particular embodiments and is not intended to be limiting of the present invention. As used herein, the singular forms "a" and "an" are intended to include the plural meanings as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Descriptions of features or aspects within each example embodiment should typically be considered as available for other similar features or aspects in other example embodiments.

FIG. 1 is a perspective view of a portable terminal including a display device according to an example embodiment of the present invention.

Referring to FIG. 1, a portable terminal (e.g., a mobile device) is illustrated as an example of an electronic device having a display device DD, according to some example embodiments of the present invention. In various embodiments, the portable terminal may include, for example, a tablet PC, a smart phone, a personal digital assistant (PDA), a portable multimedia player (PMP), a game console, a wristwatch-type (or smart watch) electronic device, and/or the like. However, the present invention is not limited thereto, and in other embodiments, the portable terminal may include any suitable electronic device having a display device (e.g., the display device DD), according to various embodiments of the present disclosure.

For example, in some embodiments, the display device DD of the present invention may be a display device used for a large electronic device, such as a television, an outdoor billboard, or the like. In other embodiments, the display device DD may be a display device used for a small and/or medium electronic device, such as a personal computer, a notebook computer, a car navigation unit, a camera, or the like. Accordingly, while various examples of the display device DD are shown in the various figures as embodied in the portable terminal (or mobile device), it should be understood that the display device DD according to various example embodiments of the present invention may be embodied in any suitable electronic device without departing from the spirit or scope of the present invention.

As illustrated in FIG. 1, a display surface on which an image IM is displayed is defined by (or is parallel to) a plane defined by a first direction DR1 and a second direction DR2. The display device DD includes a plurality of areas (e.g., DA and NDA) which are distinguishable on the display surface. For example, the display surface includes a display area DA at (e.g., in or on) which the image IM is displayed, and a non-display area NDA that is adjacent to the display area DA. In some embodiments, the non-display area NDA may be referred to as a bezel area. For example, the display area DA may have a rectangular shape. The non-display area NDA may surround the display area DA. In addition, although not illustrated in FIG. 1, in some embodiments, the display device DD may include a curved (or partially curved) shape or surface. For example, in some embodiments, the display area DA may have one or more portions (or areas) having a curved shape (or curved surface).

A front surface (e.g., an upper surface or a first surface) and a rear surface (e.g., a lower surface or a second surface) as used in this disclosure may be distinguished in a direction in which the image IM is displayed. For example, a surface toward which the image IM is displayed may be referred to as the front surface (e.g., the upper surface or the first surface), and an opposite surface may be referred to as the rear surface (e.g., the lower surface or the second surface). However, the present invention is not limited to the directions indicated by the first direction DR1, the second direction DR2, and the third direction DR3 shown in the figures, and these directions may be converted into various different directions. Hereinafter, as shown in the figures, the first direction is indicated by the reference number DR1, the second direction is indicated by the reference number DR2, and the third direction is indicated by the reference number DR3.

The display device DD according to an embodiment of the present invention may sense a user input TC applied externally (e.g., from the outside) by a user. The user input TC of the user may include various types of external inputs, for example, such as a portion of the body (e.g., a finger), light input, heat or thermal input, a touch input (e.g., from the user), or pressure input (e.g., as applied by the user). For convenience of illustration, the user input TC is shown in FIG. 1 as the user's hand applying an input (e.g., a touch input) to the front surface of the display device DD, but the present invention is not limited thereto, and the user input TC may be provided in various forms as described above, and/or may be applied to a side surface or the rear surface of the display device DD according to a structure of the display device DD.

Figure 2:
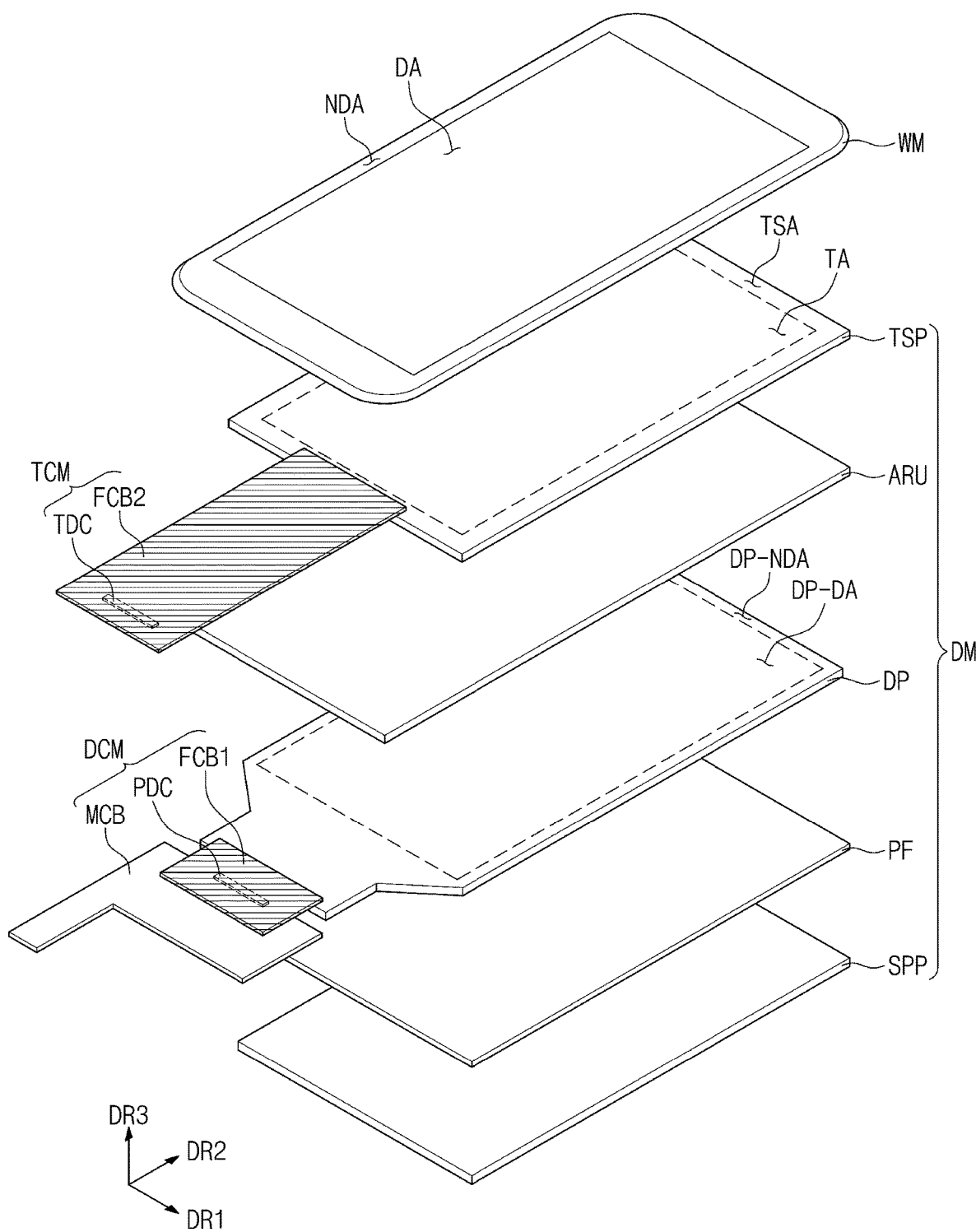
FIG. 2 is an exploded view of a display device according to an example embodiment of the present invention.

FIG. 2 is an exploded view of a display device according to an example embodiment of the present invention. In FIG. 2, some members and components may be omitted for clarity purposes. For example, in FIG. 2, adhesive members are not illustrated for clarity purposes, but are shown in more detail with reference to FIG. 5.

As illustrated in FIG. 2, the display device DD includes a window member WM and a display module DM. The window member WM defines the front surface of the display device DD. The window member WM may include a glass substrate, a sapphire substrate, a plastic substrate, and/or the like. In addition, the window member WM may include a functional coating layer, such as an anti-fingerprint layer, an anti-reflection layer, and/or a hard coating layer. Although the window member WM having a flat shape in the display area DA is illustrated in FIG. 2, the present invention is not limited thereto, and the shape of the window member WM may be variously modified. For example, in some embodiments, edges facing the first direction DR1 of the window member WM may provide a curved surface.

The display module DM is disposed on the rear surface of the window member WM to produce an image. In addition, the display module DM may sense a user input TC (e.g., touch input and/or pressure applied via user application) as shown in FIG. 1, for example.

Although FIG. 2 shows that the display module DM provides a flat display surface, the present invention is not limited thereto, and the shape of the display module DM may be variously modified. For example, in some embodiments, edges facing the first direction DR1 of the display module DM may be bent from a center (or center portions) to provide a curved surface.

In some embodiments, the display module DM may include an input sensing panel TSP, an anti-reflection unit (or anti-reflector) ARU, a display panel DP, a protective film PF, a support panel SPP, an input control unit (or input controller) TCM, and a driving control module (or driving controller) DCM.

The input sensing panel TSP obtains the coordinate information of the user input TC (e.g., illustrated in FIG. 1). The input sensing panel TSP may be referred to as a touch sensing panel. The input sensing panel TSP may sense various types of inputs provided externally of the display device DD. In an example embodiment, the input sensing panel TSP may sense the input by the user's body (e.g., the user's finger), but the present invention is not limited thereto. For example, the input sensing panel TSP may recognize various types of external inputs, for example, such as light, heat, and/or pressure. In addition, the input sensing panel TSP may sense an input that contacts a sensing surface, and/or an input that is close to (or near) a sensing surface.

In various embodiments, the input sensing panel TSP may be, for example, a capacitive touch panel, an electromagnetic induction type touch panel, and/or the like. Such an input sensing panel TSP may include signal lines connected to a base layer and sensing electrodes.

The input control module TCM includes a second circuit board FCB2 (or flexible circuit board) and an input driving circuit TDC. The second circuit board FCB2 may electrically connect the input sensing panel TSP to a main circuit board MCB, and the input driving circuit TDC may be mounted on the second circuit board FCB2. The input driving circuit TDC may be implemented as an integrated circuit. The second circuit board FCB2 may be a flexible circuit board.

The display panel DP may include various display elements. The display elements may include, for example, a liquid crystal capacitor, an organic light emitting element, an electrophoretic element, and/or an electrowetting element. For convenience, the display elements are described hereinafter as a plurality of organic light emitting diodes. That is, the display panel DP according to an example embodiment of the present invention may be a flexible display panel, for example, an organic light emitting display panel, but the present invention is not limited thereto.

The anti-reflection unit ARU may include a polarizing film and/or a phase retardation film. The number of the phase retardation films and the phase retardation length ($\lambda/4$ or $\lambda/2$) of the phase retardation films may be determined according to the operation principle of the anti-reflection unit ARU. In some embodiments, the anti-reflection unit ARU may include color filters.

The protective film PF is disposed on the rear surface of the display panel DP. The protective film PF may include a plastic film as a base layer. For example, in some embodiments, the protective film PF may include a plastic film containing any one selected from the group consisting of polyether sulfone (PES), polyacrylate (PAR), polyether imide (PEI), polyethylene naphthalate (PEN), polyethylene terephthalate (PET), polyphenylene sulfide (PPS), polyarylate, polyimide (PI), polycarbonate (PC), poly(arylene ether sulfone), and a combination thereof.

Materials constituting the protective film PF are not limited to plastic resins, and may include organic and/or inorganic composite materials. For example, in some embodiments, the protective film PF may include a porous organic layer and an inorganic material filled in the pores of the organic layer.

The support panel SPP is disposed on the rear surface of the protective film PF to support the display panel DP and the protective film PF. The support panel SPP may be a metal plate having a stiffness above a reference stiffness. For example, in some embodiments, the support panel SPP may be a stainless steel plate. In some embodiments, the support panel SPP may have a black color for blocking external light that is incident on the display panel DP.

The driving control module DCM includes a main circuit board MCB (or driving circuit board), a first circuit board FCB1 (or panel flexible circuit board), and a panel driving circuit PDC. The first circuit board FCB1 may electrically connect the main circuit board MCB to the display panel DP, and the panel driving circuit PDC may be mounted on the first circuit board FCB1. The panel driving circuit PDC may be implemented as an integrated circuit. In some embodiments, a plurality of passive elements and active elements may be mounted on the main circuit board MCB. The main circuit board MCB may be a rigid circuit board or a flexible circuit board, and the first circuit board FCB1 may be a flexible circuit board.

In an example embodiment of the present invention, the protective film PF may be omitted. In some embodiments, some configurations of the driving control module DCM may be omitted or variously changed. For example, in some embodiments, the panel driving circuit PDC may be mounted (e.g., directly mounted) on the display panel DP.

Figure 3:
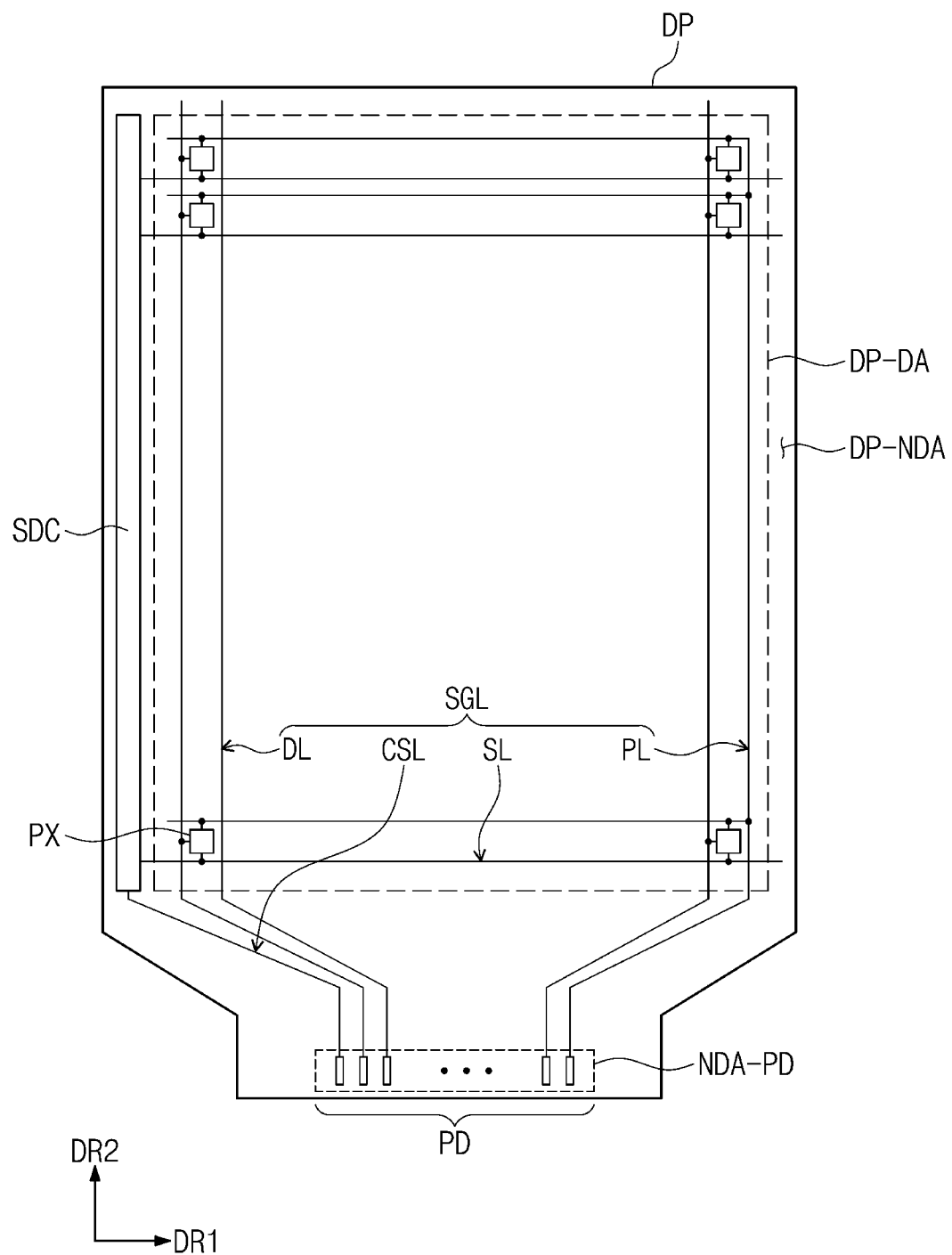
FIG. 3 is a plan view of a display panel according to an example embodiment of the present invention.

FIG. 3 is a plan view of a display panel according to an example embodiment of the present invention. FIG. 3 schematically illustrates a signal circuit diagram. In addition, in FIG. 3, some components are omitted for clarity of illustration.

As illustrated in FIG. 3, the display panel DP includes a display area DP-DA and a non-display area DP-NDA on a plane (e.g., the same plane). As shown in FIG. 3, in some embodiments, the non-display area DP-NDA may be defined along the rim (or periphery) of the display area DP-DA. The display area DP-DA and the non-display area DP-NDA of the display panel DP illustrated in FIG. 3 correspond to the display area DA and the non-display area NDA of the display device DD illustrated in FIG. 1, respectively.

The display panel DP may include a scan driving circuit SDC, a plurality of signal lines SGL (hereinafter, referred to as signal lines), a plurality of signal pads PD (hereinafter, referred to as signal pads), and a plurality of pixels PX (hereinafter, referred to as pixels). The pixels PX are disposed at (e.g., in or on) the display area DP-DA. In some embodiments, each of the pixels PX includes an organic light emitting diode and a pixel driving circuit connected thereto.

The scan driving circuit SDC generates a plurality of scan signals (hereinafter, referred to as scan signals), and outputs (e.g., sequentially outputs) the scan signals to a plurality of scan lines SL (hereinafter, referred to as scan lines), which is described in more detail below. The scan driving circuit SDC may further output another control signal to the driving circuit of the pixels PX.

In some embodiments, the scan driving circuit SDC may include a plurality of thin film transistors that are formed through a same process as those of the driving circuit of the pixels PX, for example, such as a low temperature polycrystalline silicon (LTPS) process or a low temperature polycrystalline oxide (LTPO) process.

The signal lines SGL include scan lines SL, data lines DL, a power supply line PL, and a control signal line CSL. The scan lines SL are respectively connected to corresponding pixels PX from among the pixels PX, and the data lines DL are respectively connected to corresponding pixels PX from among the pixels PX. The power supply line PL is connected to the pixels PX. The control signal line CSL may provide control signals to the scan driving circuit SDC.

The signal lines SGL overlap with the display area DP-DA and the non-display area DP-NDA. The signal lines SGL may include a pad portion and a line portion. The line portion overlaps with the display area DP-DA and the non-display area DP-NDA. The pad portion is connected to the end of the line portion. The pad portion is disposed at (e.g., in or on) the non-display area DP-NDA and overlaps with corresponding signal pads PD among the signal pads PD. The area in which the signal pads PD are disposed at (e.g., in or on) the non-display area DP-NDA may be defined as the pad area NDA-PD.

The line portion of the signal lines SGL that are connected to the pixels PX substantially includes most of the signal lines SGL. The line portion is connected to transistors of the pixel PX. The line portion may have a single layer structure or a multilayer structure, and the line portion may have a continuous body (or line) or may include two or more distinct portions. For example, when the line portion includes two or more distinct portions, the two or more distinct portions may be disposed on different layers, and may be connected to each other through a contact hole passing through an insulating layer disposed between the two or more distinct portions.

Figure 4:
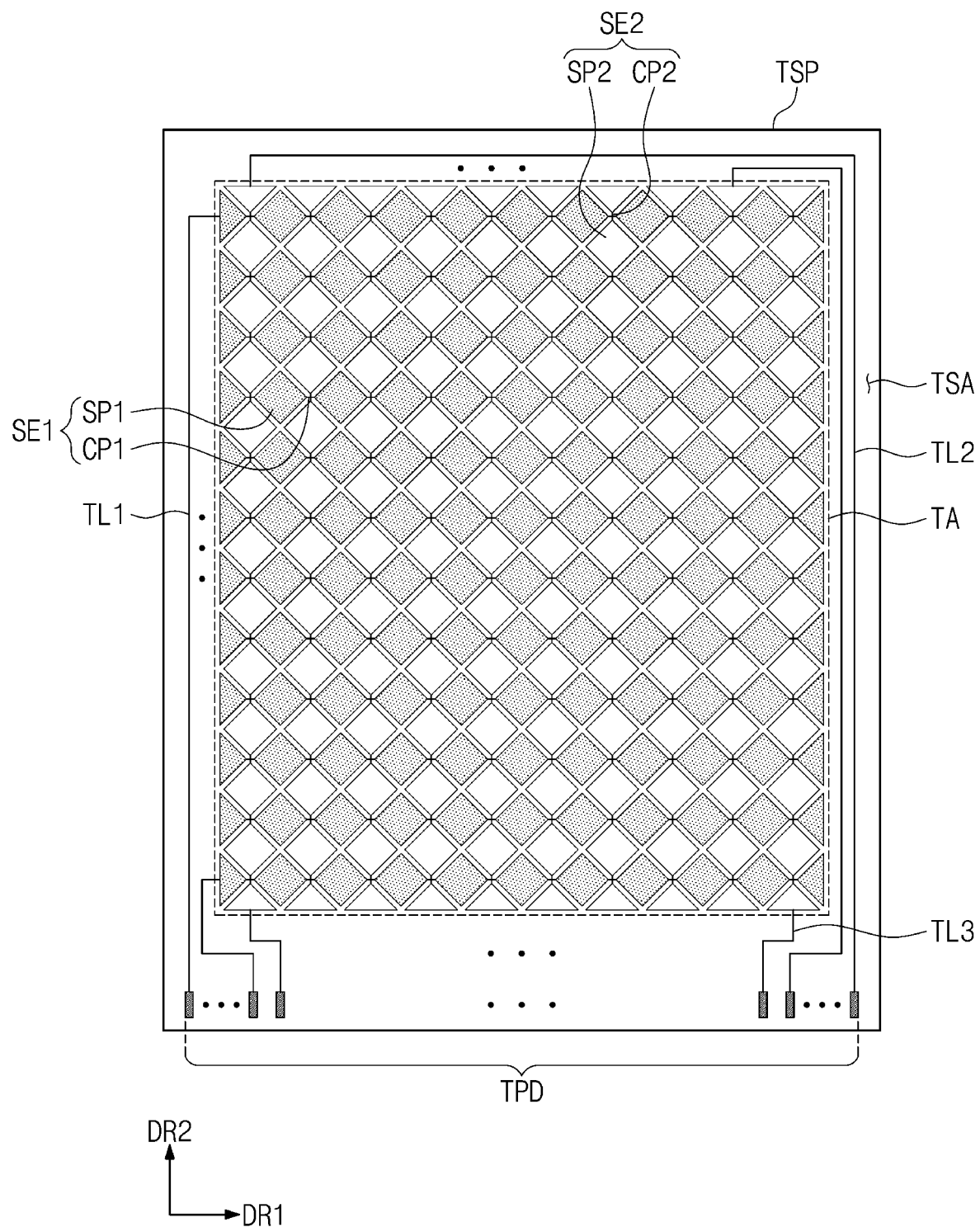
FIG. 4 is a plan view of an input sensing unit according to an example embodiment of the present invention.

FIG. 4 is a plan view of an input sensing panel according to an example embodiment of the present invention.

Referring to FIG. 4, the input sensing panel TSP may sense a user input TC (e.g., as illustrated in FIG. 1) to obtain position or intensity information of the external user input TC. The input sensing panel TSP includes a touch area TA and a touch peripheral area TSA on a same plane. As shown in FIG. 4, in some embodiments, the touch peripheral area TSA may be defined along the rim (or periphery) of the touch area TA. The touch area TA and the touch peripheral area TSA of the input sensing panel TSP illustrated in FIG. 4 may correspond to the display area DA and the non-display area NDA of the display device DD illustrated in FIG. 1, respectively.

The input sensing panel TSP includes a plurality of first sensing electrodes SE1, a plurality of second sensing electrodes SE2, a plurality of sensing lines TL1, TL2, and TL3, and a plurality of sensing pads TPD.

The first sensing electrodes SE1 and the second sensing electrodes SE2 are disposed at (e.g., in or on) the touch area TA. In some embodiments, the input sensing panel TSP may obtain information on the user input TC through variations in capacitance between the first sensing electrodes SE1 and the second sensing electrodes SE2.

Each of the first sensing electrodes SE1 extends along the first direction DR1 and is arranged along the second direction DR2. The first sensing electrodes SE1 may include a plurality of first sensing patterns SP1 and a plurality of first connection patterns CP1.

The first sensing patterns SP1 that define one first sensing electrode SE1 are disposed to be spaced apart from each other along the first direction DR1. For convenience of illustration, the first sensing patterns SP1 shown in FIG. 4 are shown shaded. The first connection patterns CP1 are disposed between the first sensing patterns SP1, and connect two adjacent first sensing patterns SP1 to each other.

Each of the second sensing electrodes SE2 extends along the second direction DR2 and is arranged along the first direction DR1. The second sensing electrodes SE2 may include a plurality of second sensing patterns SP2 and a plurality of second connection patterns CP2.

The second sensing patterns SP2 that define one second sensing electrode SE2 are disposed to be spaced apart from each other along the second direction DR2. The second connection patterns CP2 are disposed between the second sensing patterns SP2, and connect two adjacent second sensing patterns SP2 to each other.

The sensing lines TL1, TL2, and TL3 are disposed at (e.g., in or on) the touch peripheral area TSA. The sensing lines TL1, TL2, and TL3 may include first sensing lines TL1, second sensing lines TL2, and third sensing lines TL3. The first sensing lines TL1 are connected to the first sensing electrodes SE1, respectively. The second sensing lines TL2 are connected to one ends of the second sensing electrodes SE2, respectively.

The third sensing lines TL3 are connected to another ends of the second sensing electrodes SE2, respectively. The other ends of the second sensing electrodes SE2 may face away from the one ends of the second sensing electrodes SE2. According to an example embodiment of the present invention, the second sensing electrodes SE2 may be connected to the second sensing lines TL2 and the third sensing lines TL3. Accordingly, although the length of the second sensing electrodes SE2 is longer than that of the first sensing electrodes SE1, the sensitivity according to the area may be uniformly maintained. However, the present invention is not limited thereto, and in another example, the third sense lines TL3 may be omitted and are not limited to any particular embodiment.

The sensing pads TPD are disposed at (e.g., in or on) the touch peripheral area TSA. The sensing pads TPD are respectively connected to the sensing lines TL1, TL2, and TL3, and electrically provide (or connect) external signals to each of the first sensing electrodes SE1 and the second sensing electrodes SE2.

Hereinafter, the display device DD according to various embodiments of the present invention will be described in more detail with reference to FIGS. 5 and 6.

Figure 5:
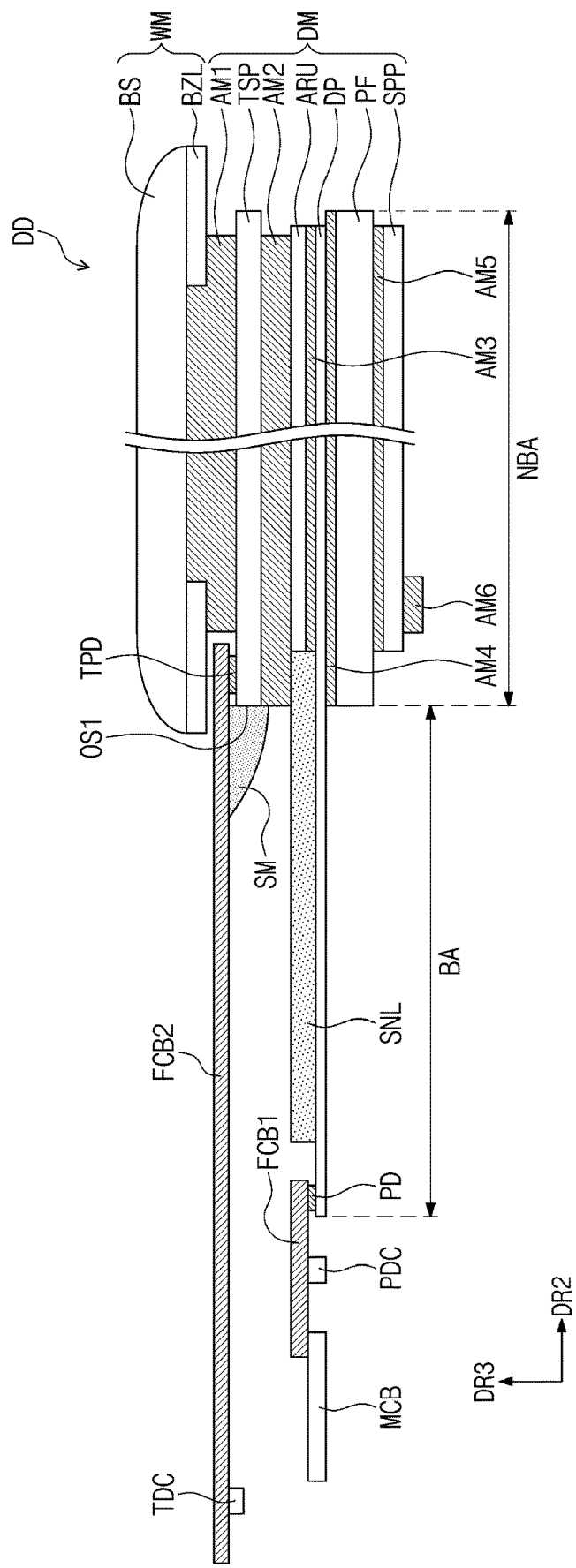
FIG. 5 is a side view of a display device according to an example embodiment of the present invention.
Figure 6:
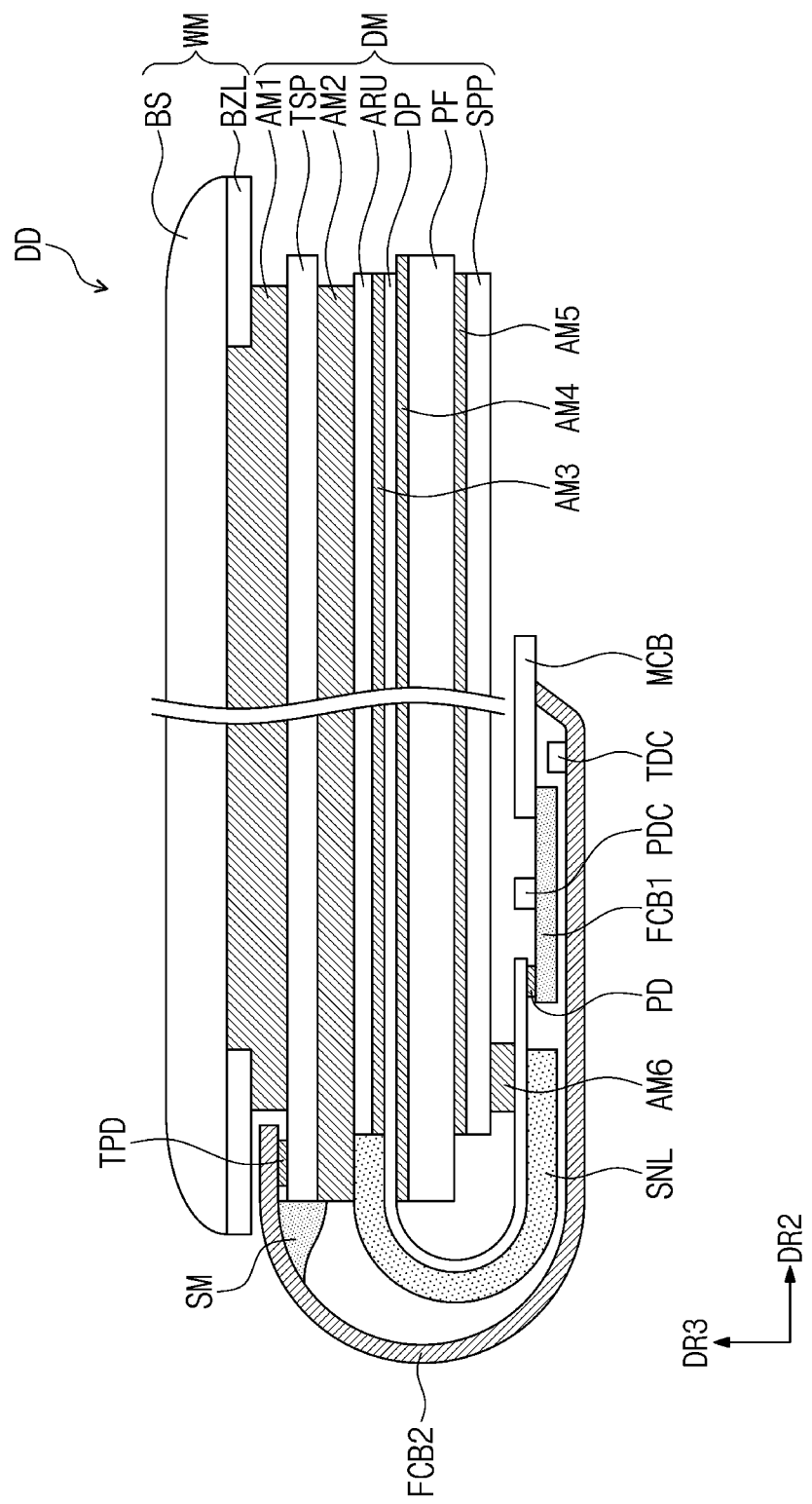
FIG. 6 is a side view of a display device according to an example embodiment of the present invention.

FIGS. 5 and 6 are side views of a display device DD according to some embodiments of the present invention. FIG. 5 illustrates a display panel DP in an unfolded (or unbent) state, and FIG. 6 illustrates the display panel DP in a bent (or folded) state.

Referring to FIGS. 5 and 6, the display device DD includes a window member WM and a display module DM. The window member WM includes a base member BS and a bezel layer BZL disposed on the rear surface of the base member BS. The area in which the bezel layer BZL is disposed is defined as a non-display area NDA (e.g., as illustrated in FIG. 1). Although the window member WM is illustrated in FIGS. 5 and 6 as having a flat shape (or a flat surface) in the display area DA, the shape of the window member WM may be variously modified. For example, in some embodiments, the edges facing the first direction DR1 of the window member WM may be curved to provide a curved surface of the window member WM.

The base member BS may include a glass substrate, a sapphire substrate, a plastic substrate, or the like. The base member BS may have a multilayer structure or single layer structure. For example, the base member BS may include a plurality of plastic films bonded to each other with an adhesive (e.g., one or more adhesive layers). In some embodiments, the base member BS may include a glass substrate and a plastic film bonded to the glass substrate with an adhesive member (e.g., one or more adhesive layers).

The bezel layer BZL may have a single layer structure or a multilayer structure. In some embodiments, if the bezel layer BZL has a multilayer structure, the multilayered bezel layer BZL may include a buffer layer for improving adhesion, a pattern layer for providing a pattern (e.g., a predetermined pattern), and an achromatic layer. The pattern layer may provide a pattern referred to as a hairline. The achromatic layer may include an organic mixture including a black pigment or dye. In various embodiments, the above-described layers of the bezel layer BZL may be formed by deposition, printing, coating, or the like. In some embodiments, the window member WM may further include a functional coating layer disposed on the front surface of the base member BS. For example, in some embodiments, the functional coating layer may include an anti-fingerprint layer, an anti-reflection layer, and/or a hard coat layer.

The display module DM may include the display panel DP, an input sensing panel TSP, an anti-reflection unit (e.g., an anti-reflector) ARU, a protective film PF, and a support panel SPP.

As described in more detail below, in some embodiments, a first adhesive member (or adhesive layer) to a sixth adhesive member (or adhesive layer) AM1 to AM6 may include a pressure sensitive adhesive film (PSA), an optically clear adhesive film (OCA), and/or an optically clear resin (OCR). In some embodiments, the first adhesive member to the sixth adhesive member AM1 to AM6 may include a photo-curing adhesive material or a heat-curing adhesive material, but the present invention is not limited thereto. In addition, in some embodiments, some of the first adhesive member to the sixth adhesive member AM1 to AM6 may be omitted.

The input sensing panel TSP is disposed on the rear surface of the window member WM. The window member WM and the input sensing panel TSP may be connected (or bonded) to each other by the first adhesive member AM1. The anti-reflection unit ARU is disposed on the rear surface of the input sensing panel TSP. The input sensing panel TSP and the anti-reflection unit ARU may be connected (or bonded) to each other by the second adhesive member AM2. The display panel DP is disposed on the rear surface of the anti-reflection unit ARU. The anti-reflection unit ARU and the display panel DP may be connected (or bonded) to each other by the third adhesive member AM3. In some embodiments, the third adhesive member AM3 may have a relatively thin thickness when compared with the thicknesses of the first adhesive member AM1 and the second adhesive member AM2. In some embodiments, the positions (or locations) of the anti-reflection unit ARU and the input sensing panel TSP may be switched with each other.

A second circuit board FCB2 is connected to one side (e.g., a first side or a first side surface, such as a upper surface) of the input sensing panel TSP. An input driving circuit TDC is mounted on (or attached to) the rear surface of the second circuit board FCB2. As shown in FIG. 6, when the second circuit board FCB2 is in a bent (or folded) state, the second circuit board FCB2 may be connected to a main circuit board MCB. In an example embodiment, the main circuit board MCB and the second circuit board FCB2 are illustrated to be in direct contact with each other, but the present invention is not limited thereto. For example, the main circuit board MCB and the second circuit board FCB2 may be electrically connected to each other by a conductive member disposed between the main circuit board MCB and the second circuit board FCB2 in a thickness direction (e.g., the third direction DR3) of the display module DM.

A reinforcing member SM is disposed below (e.g., on the rear surface of) the second circuit board FCB2. For example, the reinforcing member SM is disposed between the lower portion of the second circuit board FCB2 and one side (e.g., a second side or a second side surface) OS1 adjacent to the first side of the input sensing panel TSP. The reinforcing member SM covers a portion of the lower portion of the second circuit board FCB2. In some embodiments, the thickness of the reinforcing member SM decreases as the distance from the one side (e.g., the second side) OS1 of the input sensing panel TSP increases. When the second circuit board FCB2 is flat without being folded or bent, the lower surface of the reinforcing member SM may have an inclined (or sloped) plane from a lower end of the one side (e.g., the second side) OS1 of the input sensing panel TSP toward the rear surface of the second circuit board FCB2.

The reinforcing member SM may include an insulating material. The reinforcing member SM may include a resin that may be cured by ultraviolet rays. For example, the reinforcing member SM may include an acrylic resin. In some embodiments, the resin for forming the reinforcing member SM is applied to the lower portion of the second circuit board FCB2, and the applied resin is cured by ultraviolet rays to form the reinforcing member SM. After the reinforcing member SM is formed, the second circuit board FCB2 may be bent or folded.

For example, the second circuit board FCB2 may be bent or folded toward the rear surface direction of the display module DM. In an example embodiment of the present invention, the reinforcing member SM is disposed between the rear surface of the second circuit board FCB2 and the second side OS1 of the input sensing panel TSP, thereby enhancing (or reinforcing) a bending area (or folding area) BA of the second circuit board FCB2. Accordingly, the second circuit board FCB2 may be prevented or substantially prevented from being bent (or folded) more greatly (e.g., over bent) in the bending area BA, and cracks may not occur in wirings (or wires) disposed on a surface (e.g., the upper surface) of the second circuit board FCB2.

In FIGS. 5 and 6, the display panel DP is schematically illustrated as a single layer for convenience. However, it should be appreciated that the display panel DP may include a base layer, a circuit layer, a light emitting element layer, an encapsulation layer, and/or the like.

The rear surface of the display panel DP and the protective film PF may be connected (or bonded) to each other by the fourth adhesive member AM4.

The protective film PF and the support panel SPP may be connected (or bonded) to each other by the fifth adhesive member AM5.

A portion of the display panel DP may be disposed corresponding to the bending area BA. The display module DM may further include a protective member SNL (or a stress neutralizing layer) disposed on a upper surface of the display panel DP so as to correspond to at least the bending area BA. A portion of the protective member SNL may partially overlap with a non-bending area NBA of the display panel DP. The protective member SNL may include a plastic film that is similar to or substantially the same as the protective film PF.

As shown in more detail in FIG. 6, the display panel DP when in a bent (or folded) state may be connected to (e.g., bonded to) the support panel SPP by the sixth adhesive member AM6. The sixth adhesive member AM6 may also serve as a spacer for maintaining or substantially maintaining a curvature radius of the bending area BA.

In an example embodiment, the main circuit board MCB is illustrated in FIG. 6 as being in direct contact with the first circuit board FCB1, but the present invention is not limited thereto. For example, in some embodiments, the main circuit board MCB may be electrically connected to the first circuit board FCB1 by a conductive member disposed between the main circuit board MCB and the first circuit board FCB1 in the thickness direction (e.g., the third direction DR3) of the display module DM.

As illustrated in FIGS. 5 and 6, the reinforcing member SM may be disposed to be spaced apart from the protective member SNL by a distance (e.g., a predetermined distance). Thus, as will be described in more detail with reference to FIG. 7, the reinforcing member SM is prevented or substantially prevented from contacting the protective member SNL, which may prevent or reduce damage from occurring in the second circuit board FCB2.

Figure 7:
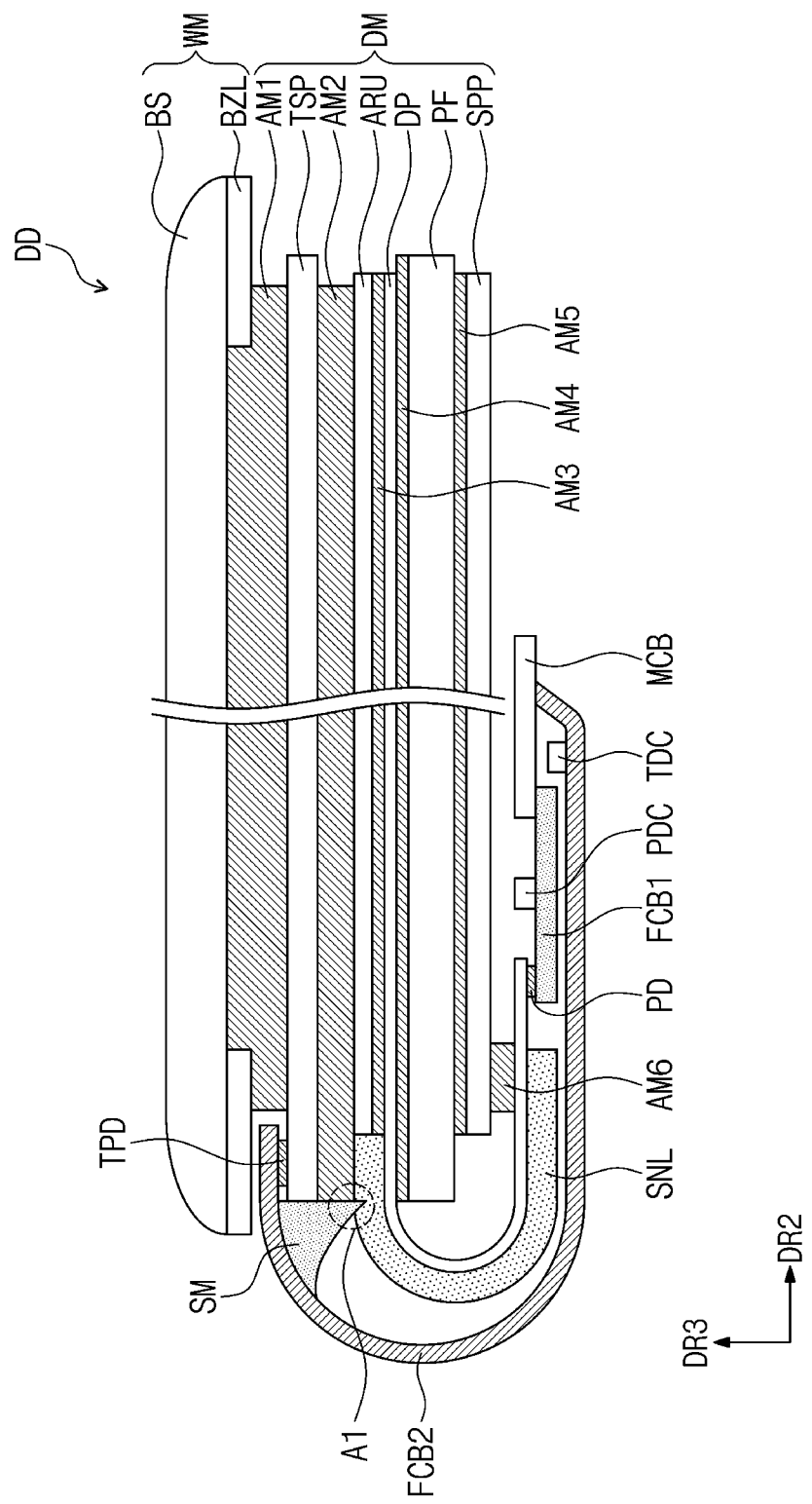
FIG. 7 is an illustration of a display device in a bent state.

FIG. 7 is illustrating illustrations of a display device in a bent (or folded) state.

As illustrated in FIG. 7, when a thickness (e.g., a maximum thickness) of the reinforcing member SM is thicker than the sum of thicknesses of the input sensing panel TSP and the second adhesive member AM2 in the thickness direction (e.g., the third direction DR3) of the display module DM, a portion (or area) A1 of the reinforcing member SM may come into contact with the protective member SNL. When the reinforcing member SM comes into contact with the protective member SNL in a state in which both the second circuit board FCB2 and the display panel DP are bent, the portion A1 of the reinforcing member SM having a sharp tip shape (e.g., a sharp peak or mountain-shape) may serve as a lever to deform the shape of the second circuit board FCB2. In this case, the wiring arranged on the upper surface of the second circuit board FCB2 may be damaged.

FIGS. 8A to 8D are illustrations of a method for manufacturing an input sensing unit (e.g., an input sensor or an input sensing device).

Figure 8A:
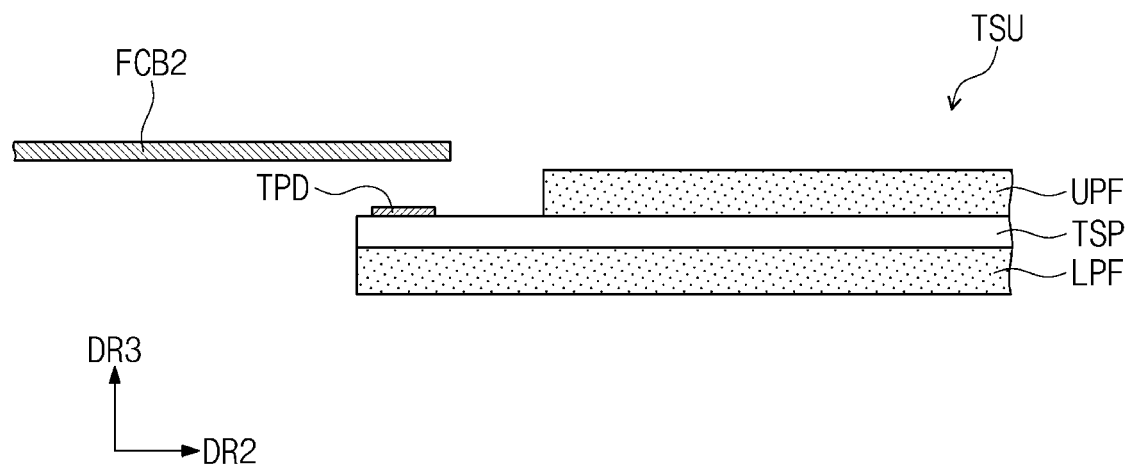
FIGS. 8A to 8D are illustrations of a method for manufacturing an input sensing unit.

Referring to FIG. 8A, the input sensing unit TSU includes an input sensing panel TSP, an upper protective film UPF, a lower protective film LPF, and a second circuit board FCB2. The input sensing unit TSU may be referred to as a touch sensing unit for sensing the external user inputs TC (e.g., proximity touch, direct touch, pressure, or the like).

The input sensing panel TSP includes a sensing pad TPD disposed (e.g., provided) on one side (or front surface) of the input sensing panel TSP. One side (e.g., a rear surface) of the second circuit board FCB2 is electrically connected to the input sensing panel TSP through the sensing pad TPD. In this case, the sensing pad TPD may electrically connect the second circuit board FCB2 to the input sensing panel TSP, and may physically connect (or combine) the second circuit board FCB2 and the input sensing panel TSP.

The upper protective film UPF protects the upper surface of the input sensing panel TSP, and the lower protective film LPF protects the lower surface of the input sensing panel TSP. Each of the upper protective film UPF and the lower protective film LPF has a sufficient thickness (e.g., a predetermined thickness) in the third direction DR3 in order to protect the input sensing panel TSP from external stimuli. Each of the upper protective film UPF and the lower protective film LPF may be a peelable film.

Figure 8B:
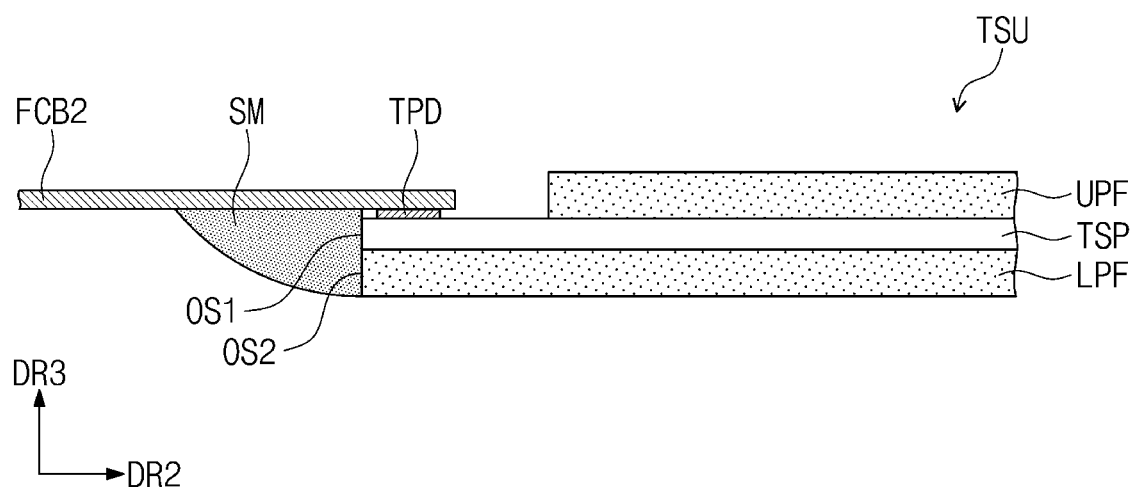

Referring to FIG. 8B, a reinforcing member SM is disposed between the lower portion of the second circuit board FCB2 and the second side surface OS1 that is adjacent to the first side of the input sensing panel TSP in a state in which the second circuit board FCB2 and the input sensing panel TSP are coupled (or connected) to each other.

The reinforcing member SM may include an insulating material. The reinforcing member SM may include a resin which may be cured by ultraviolet rays. For example, the reinforcing member SM may include an acrylic resin. The resin for forming the reinforcing member SM is applied to the lower portion of the second circuit board FCB2, and the applied resin is cured by ultraviolet rays to form the reinforcing member SM. The reinforcing member SM is disposed adjacent to (or on) the one side surface OS1 of the input sensing panel TSP and one side surface (e.g., second side surface OS2) of the lower protective film LPF. In other words, a lower surface of the reinforcing member SM is formed to extend to a lower portion of the one side surface OS2 of the lower protective film LPF.

Figure 8C:
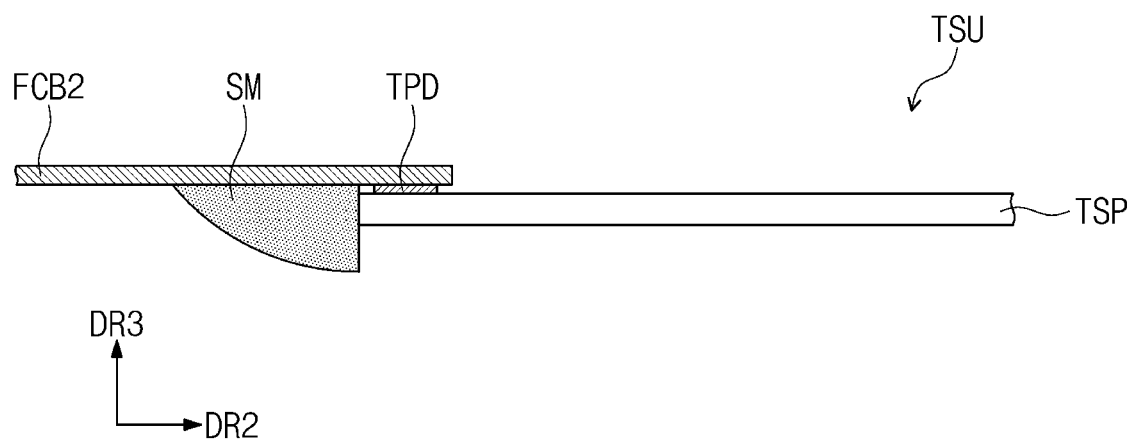

Referring to FIG. 8C, after the reinforcing member SM is formed, the upper protective film UPF and the lower protective film LPF are removed from the input sensing panel TSP (e.g., respectively).

Figure 8D:
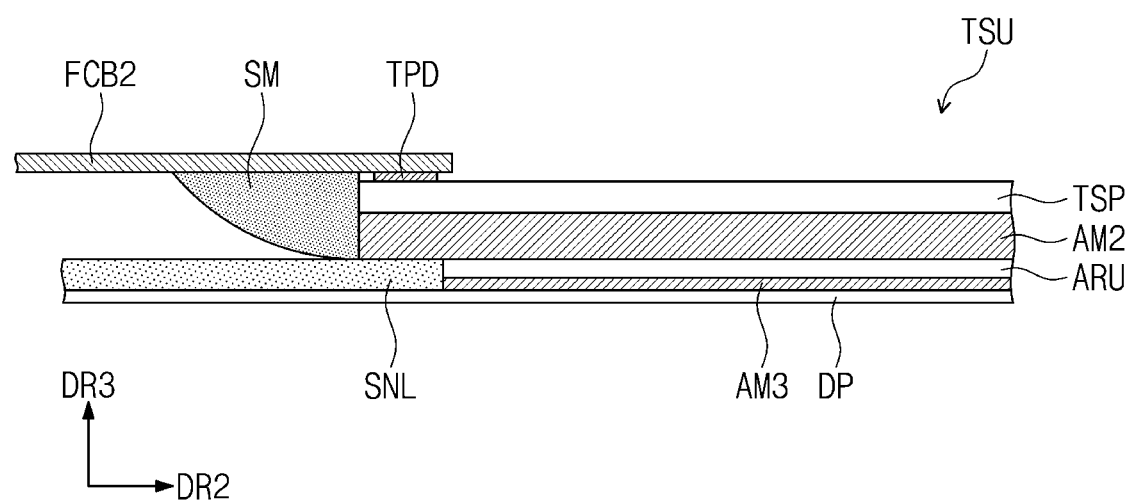

Referring to FIG. 8D, the display panel DP, on which an anti-reflection unit (or an anti-reflector) ARU is attached is connected (e.g., bonded) to the input sensing panel TSP by a second adhesive member AM2.

During the forming of the reinforcing member SM as illustrated in FIG. 8B, the shape of the lower surface of the reinforcing member SM is formed along the one side surface OS2 of the lower protective film LPF due to a capillary phenomenon by material properties, and when the lower protective film LPF is removed, the shape of the reinforcing member SM is the sharp tip shape (e.g., as a sharp peak or a sharp mountain-shape). In this case, when the lower surface of the reinforcing member SM is formed to be lower than the lower surface of the second adhesive member AM2, the reinforcing member SM may come into contact with the protective member SNL at the portion or area A1 (e.g., as illustrated in FIG. 7).

Figure 9A:
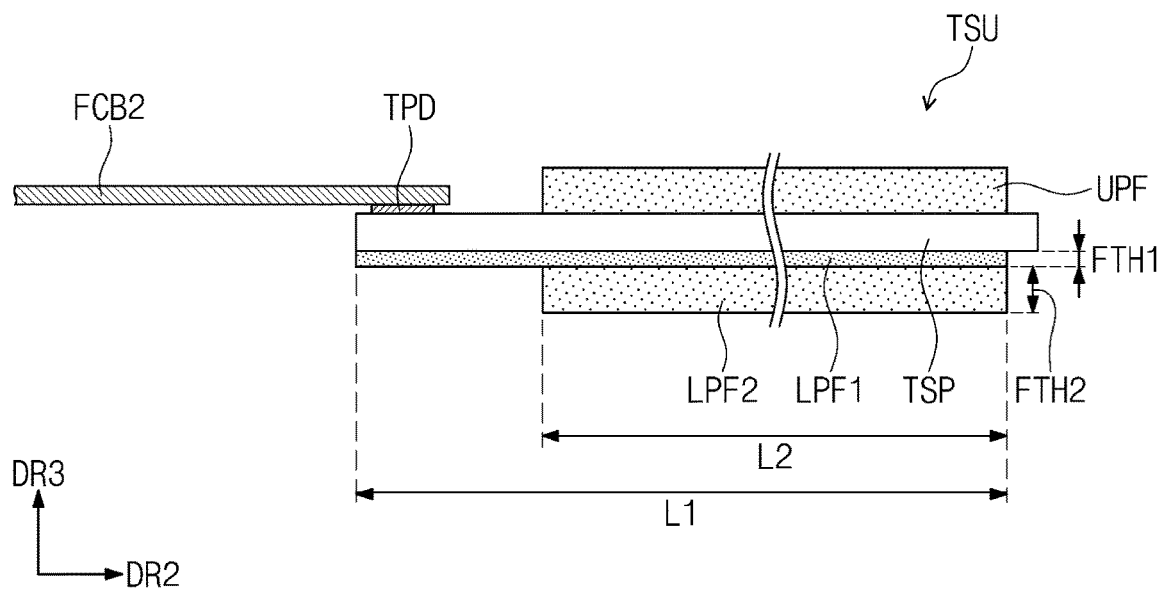
FIGS. 9A and 9B are views illustrating a method for manufacturing an input sensing unit according to an example embodiment.
Figure 9B:
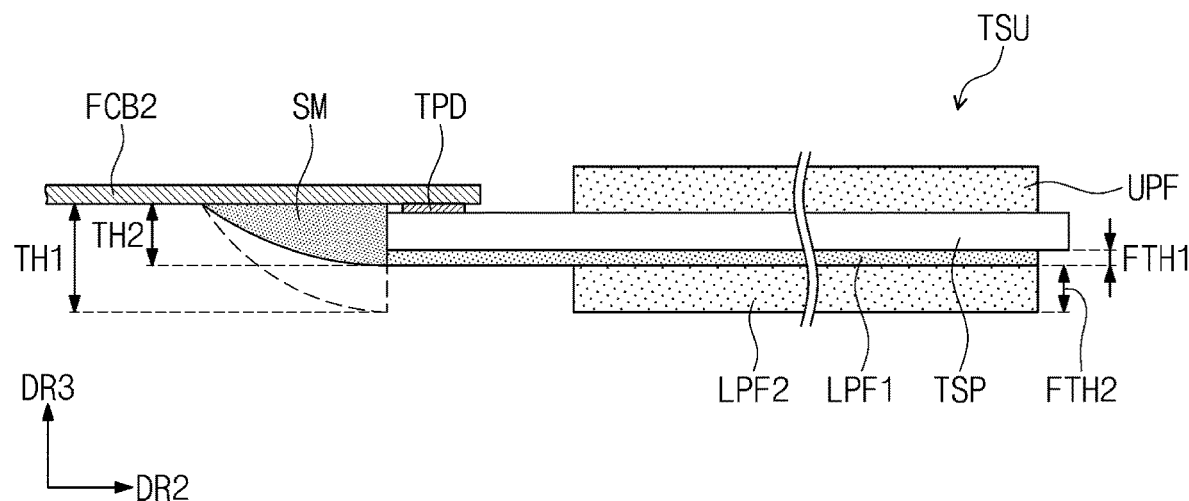

FIGS. 9A and 9B are views illustrating a method for manufacturing an input sensing unit (e.g., an input sensor or an input sensing device) according to an example embodiment.

Referring to FIG. 9A, the input sensing unit TSU includes an input sensing panel TSP, an upper protective film UPF, a first lower protective film LPF1, a second lower protective film LPF2, and a second circuit board FCB2. The input sensing panel TSP includes a sensing pad TPD provided on one side thereof. One side of the second circuit board FCB2 is electrically connected to the input sensing panel TSP through the sensing pad TPD. In example embodiments, the sensing pad TPD may electrically connect the second circuit board FCB2 to the input sensing panel TSP, and may also physically connect (or combine) the second circuit board FCB2 and the input sensing panel TSP.

The upper protective film UPF protects the upper surface of the input sensing panel TSP, and the first lower protective film LPF1 and the second lower protective film LPF2 protect the lower surface of the input sensing panel TSP. In example embodiments, the first lower protective film LPF1 is disposed below the input sensing panel TSP, and the second lower protective film LPF2 is disposed below the first lower protective film LPF1. In some embodiments, each of the upper protective film UPF, the first lower protective film LPF1, and the second lower protective film LPF2 may be a peelable film.

In some embodiments, the first lower protective film LPF1 has a first length L1 in the second direction DR2, and the second lower protective film LPF2 has a second length L2 in the second direction DR2. The first length L1 of the first lower protective film LPF1 and the second length L2 of the second lower protective film LPF2 may be different from each other. For example, as shown in the embodiment of FIG. 9A, the first length L1 of the first lower protective film LPF1 may be the same as or almost the same as (e.g., substantially equal to) the length of the input sensing panel TSP in the second direction DR2. In addition, the second length L2 of the second lower protective film LPF2 may be shorter than the first length L1 of the first lower protective film LPF1.

In some embodiments, the first lower protective film LPF1 has a first thickness FTH1 in the third direction DR3, and the second lower protective film LPF2 has a second thickness FTH2 in the third direction DR3. The first thickness FTH1 of the first lower protective film LPF1 and the second thickness FTH2 of the second lower protective film LPF2 may be different from each other. For example, as shown in the embodiment of FIG. 9A, the first thickness FTH1 of the first lower protective film LPF1 is less than the second thickness FTH2 of the second lower protective film LPF2.

Referring to FIG. 9B, a reinforcing member SM is disposed between the lower portion of the second circuit board FCB2 and the one side surface (e.g., the second side) adjacent to the one side (e.g., the first side) of the input sensing panel TSP in a state in which the second circuit board FCB2 and the input sensing panel TSP are coupled (or connected) to each other.

The reinforcing member SM may include an insulating material. The reinforcing member SM may include a resin which may be cured by ultraviolet rays. For example, in some embodiments, the reinforcing member SM may include an acrylic resin. The resin for forming the reinforcing member SM may be applied to the lower portion of the second circuit board FCB2, and the applied resin may be cured by ultraviolet rays to form the reinforcing member SM. According to example embodiments, the reinforcing member SM is disposed adjacent to (or on) the one side surface of the input sensing panel TSP and one side surface of the first lower protective film LPF1. Accordingly, the lower surface of the reinforcing member SM is formed on the lower portion of the one side surface of the first lower protective film LPF1.

However, when compared to the examples shown in FIGS. 8A to 8D, because the one side surface of the first lower protective film LPF1 and one side surface of the second lower protective film LPF2 are spaced apart from each other in the embodiment shown in FIG. 9B, the lower surface of the reinforcing member SM may be formed on the lower portion of the one side surface of the first lower protective film LPF1, but not on the one side surface of the second lower protective film LPF2.

When the lower surface of the reinforcing member SM is formed on the lower portion of the one side surface of the first lower protective film LPF1, but not on the one side surface of the second lower protective film LPF2, a thickness TH2 of the reinforcing member SM may be less than a thickness TH1 of a reinforcing member SM that is formed on the lower portion of the one side surface of the second lower protective film LPF2 (e.g., as shown in FIG. 8B). For example, in some embodiments, the thickness TH1 may be 125 µm and the thickness TH2 may be 85-90 µm.

Furthermore, the thickness TH2 of the reinforcing member SM may be reduced or minimized by reducing (or minimizing) the first thickness FTH1 of the first lower protective film LPF1. In addition, according to an example embodiment, the first thickness FTH1 of the first lower protective film LPF1 may be reduced or minimized, and the second lower protective film LPF2 may provide sufficient protection to the lower portion of the input sensing panel TSP.

After the first lower protective film LPF1 and the second lower protective film LPF2 are removed from the input sensing panel TSP, an anti-reflection unit (e.g., an anti-reflector) ARU and a display panel DP may be coupled (or connected) to the lower portion of the input sensing panel TSP.

Referring to FIGS. 5 and 9B, when the lower surface of the reinforcing member SM is formed on the lower portion of the one side surface of the first lower protective film LPF1 but not on the one side surface of the second lower protective film LPF2, when the first lower protective film LPF1 is removed and the second adhesion member AM2 is disposed, the reinforcing member SM overlaps a portion of one side surface (e.g., the side surface adjacent to the second side OS1 of the input sensing panel TSP) of the second adhesive member AM2. Accordingly, the reinforcing member SM does not come into contact with the protective member SNL. Accordingly, the interference phenomenon (or damage caused) between the reinforcing member SM and the protective member SNL may be prevented or reduced.

Figure 10A:
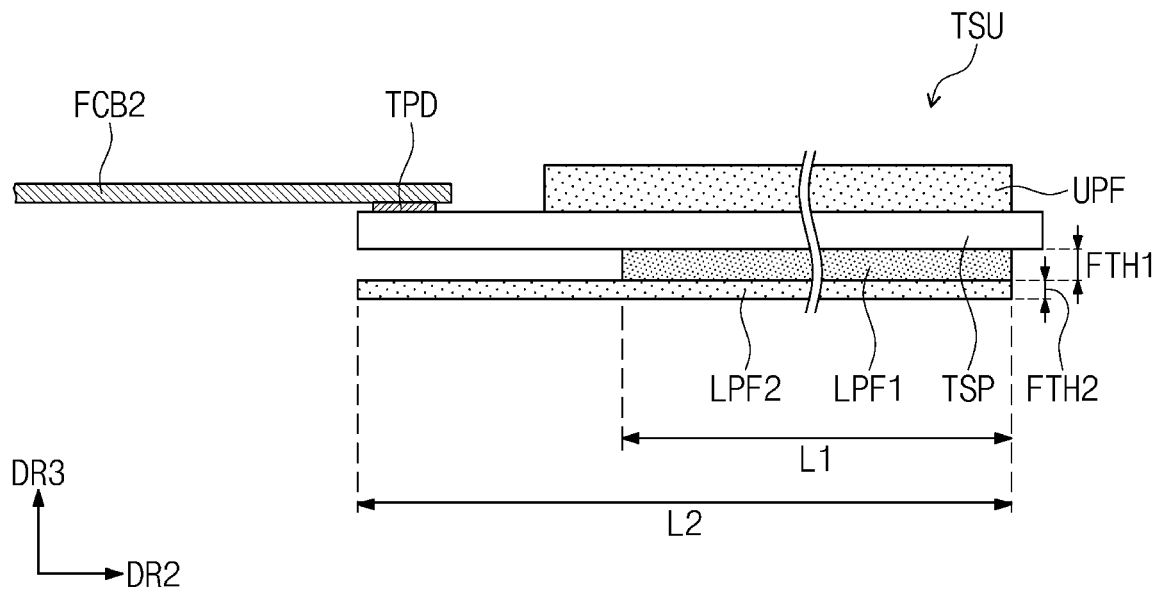
FIGS. 10A and 10B are views illustrating a method for manufacturing an input sensing unit according to an example embodiment.
Figure 10B:
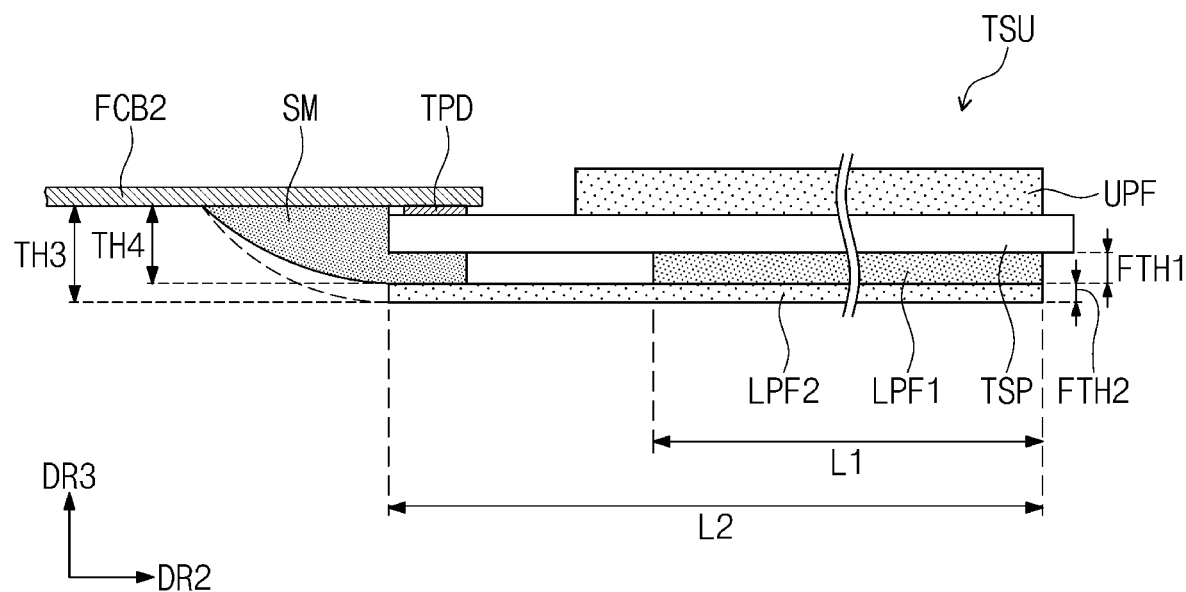

FIGS. 10A and 10B are views illustrating a method for manufacturing an input sensing unit according to an example embodiment.

Referring to FIG. 10A, the input sensing unit TSU includes an input sensing panel TSP, an upper protective film UPF, a first lower protective film LPF1, a second lower protective film LPF2, and a second circuit board FCB2.

The first lower protective film LPF1 has a first length L1 in the second direction DR2, and the second lower protective film LPF2 has a second length L2 in the second direction DR2. The first length L1 of the first lower protective film LPF1 and the second length L2 of the second lower protective film LPF2 may be different from each other. For example, in the embodiment shown in FIG. 10A, the second length L2 of the second lower protective film LPF2 is the same as or almost the same as (e.g., substantially equal to) the length of the input sensing panel TSP in the second direction DR2. In addition, in some embodiments, the first length L1 of the first lower protective film LPF1 is shorter than the second length L2 of the second lower protective film LPF2.

The first lower protective film LPF1 has a first thickness FTH1 in the third direction DR3, and the second lower protective film LPF2 has a second thickness FTH2 in the third direction DR3. The first thickness FTH1 of the first lower protective film LPF1 and the second thickness FTH2 of the second lower protective film LPF2 may be different from each other. For example, as shown in the embodiment of FIG. 10A, the first thickness FTH1 of the first lower protective film LPF1 is thicker than the second thickness FTH2 of the second lower protective film LPF2.

Referring to FIG. 10B, a reinforcing member SM is disposed between the lower portion of the second circuit board FCB2 and the one side surface (e.g., the second side) adjacent to the one side (e.g., the first side) of the input sensing panel TSP in a state in which the second circuit board FCB2 and the input sensing panel TSP are coupled (or connected) to each other.

The reinforcing member SM may include an insulating material. The reinforcing member SM may include a resin that may be cured by ultraviolet rays. In some embodiments, the reinforcing member SM is disposed on one side surface (e.g., the second side) of the input sensing panel TSP and adjacent to one side surface of the first lower protective film LPF1. In addition, the reinforcing member SM may be disposed between the input sensing panel TSP and the second lower protective film LPF2, to overlap with a portion of the second lower protective film LPF2. For example, the lower surface of the reinforcing member SM is formed to cover a portion of the lower surface of the input sensing panel TSP.

In some embodiments, because the lower surface of the reinforcing member SM is formed according to the first thickness FTH1 of the first lower protective film LPF1 under the input sensing panel TSP, a thickness TH4 of the reinforcing member SM is less than a thickness TH3 of a reinforcing member SM having a lower portion that is formed on the lower portion of the one side surface of the second lower protective film LPF2.

For example, the thickness TH3 may be 125 μm and the thickness TH4 may be 100-105 μm.

After the first lower protective film LPF1 and the second lower protective film LPF2 are removed from the input sensing panel TSP, an anti-reflection unit (e.g., an anti-reflector) ARU and a display panel DP are coupled (e.g., connected) to the lower portion of the input sensing panel TSP.

Figure 11:
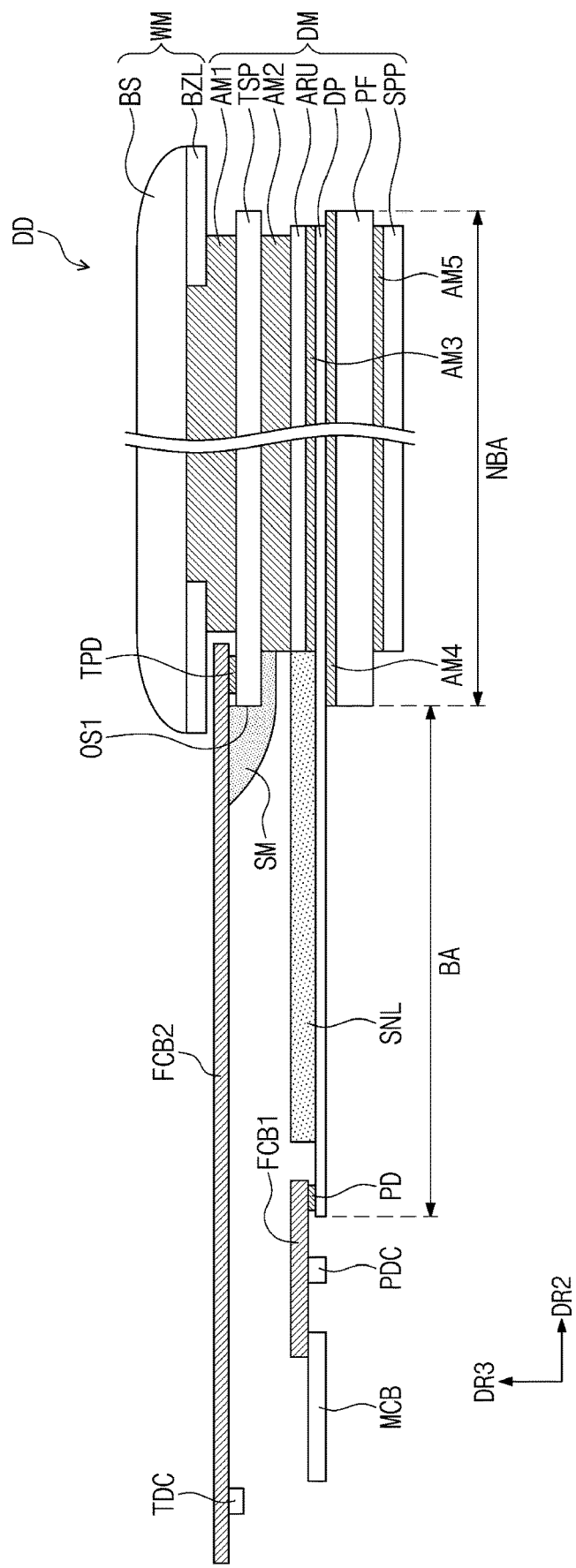
FIG. 11 is a side view of a display device according to an example embodiment of the present invention.

FIG. 11 is a side view of a display device DD according to an example embodiment of the present invention.

Referring to FIGS. 10B and 11, because the lower surface of the reinforcing member SM is formed according to the first thickness FTH1 of the first lower protective film LPF1 under the input sensing panel TSP, when the first lower protective film LPF1 is removed and the second adhesion member AM2 is disposed, the reinforcing member SM overlaps with a portion of one side surface of the second adhesive member AM2. Accordingly, the reinforcing member SM does not come into contact with the protective member SNL.

Figure 12:
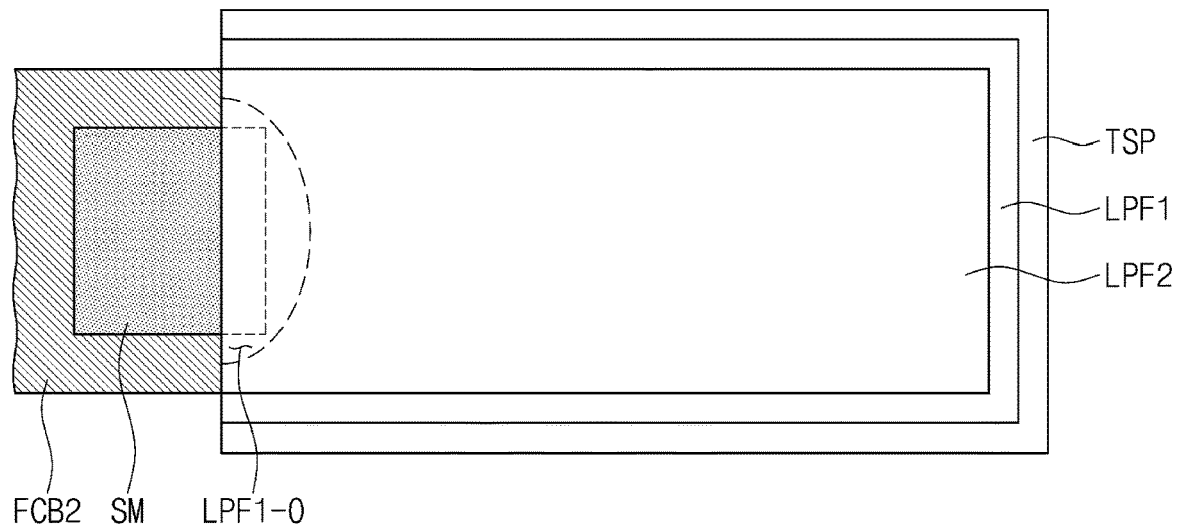
FIG. 12 is a plan view illustrating a bottom portion of an input sensing unit according to an embodiment of the present invention.
Figure 12:
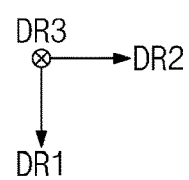

FIG. 12 is a plan view illustrating a lower portion of an input sensing unit (e.g., an input sensor or an input sensing device) according to an example embodiment of the present invention.

Referring to FIG. 12, a first lower protective film LPF1 is disposed below an input sensing panel TSP. A second lower protective film LPF2 is disposed below the first lower protective film LPF1.

In an example embodiment illustrated in FIGS. 10A and 10B, because the first length L1 of the first lower protective film LPF1 is shorter than the second length L2 of the second lower protective film LPF2, a space (e.g., an empty space) is formed between the input sensing panel TSP and the second lower protective film LPF2.

When a portion to which the second lower protective film LPF2 and the input sensing panel TSP are not attached stretches toward the lower direction of the input sensing panel TSP, the input sensing panel TSP may be bent and may cause an undesirable failure.

Referring to back to FIG. 12, the first lower protective film LPF1 is provided with an opening LPF1-O in an area in which a reinforcing member SM is to be disposed. The length of the opening LPF1-O in the first direction DR1 is shorter than the length of the first lower protective film LPF1 in the first direction DR1 and longer than the length of the reinforcing member SM in the first direction DR1.

The other portions of the first lower protective film LPF1 (e.g., except the opening LPF1-O) are attached to the input sensing panel TSP. In this case, as the opening LPF1-O of the first lower protective film LPF1 is reduced or minimized, the second lower protective film LPF2 may be prevented from stretching toward the lower direction of the input sensing panel TSP.

Figure 13:
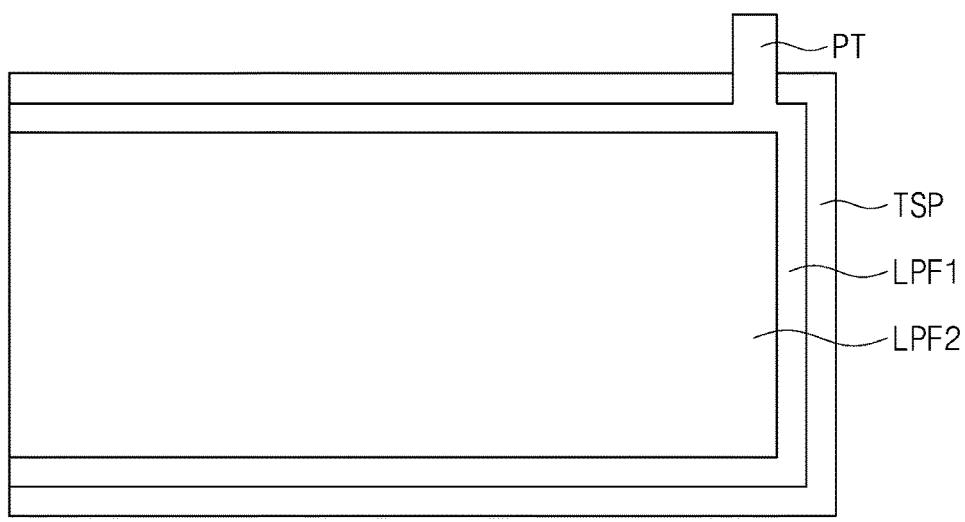
FIG. 13 is a plan view illustrating a bottom portion of an input sensing unit according to an embodiment of the present invention.
Figure 13:
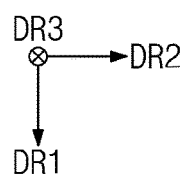

FIG. 13 is a plan view illustrating a lower surface of an input sensing unit according to an example embodiment of the present invention.

Referring to FIG. 13, a first lower protective film LPF1 is disposed below an input sensing panel TSP. A second lower protective film LPF2 is disposed below the first lower protective film LPF1.

The first lower protective film LPF1 includes a pull tab PT extending from one side thereof.

As illustrated in FIGS. 9B and 10B, after a reinforcing member SM is formed on the lower surface of a second circuit board FCB2, the first lower protective film LPF1 and the second lower protective film LPF2 are removed.

At this time, the pull tab PT may be provided on the first lower protective film LPF1 so as to facilitate removal of the first lower protective film LPF1 and the second lower protective film LPF2 at a time (e.g., concurrently or sequentially). The pull tab PT may be disposed on at least one side from among the four sides of the first lower protective film LPF1.

According to various aspects and features of the present invention, an input sensing unit may reinforce the bending portion of the flexible circuit board by disposing the reinforcing member on one side of the input sensing panel and below the flexible circuit board. In an example embodiment, the thickness of the reinforcing member is optimized, and accordingly the interference phenomenon between the reinforcing member and the protective member for a display panel may be minimized or reduced. Therefore, crack occurrence may be prevented or reduced in the wirings disposed at (e.g., in or on) the bending area of the flexible circuit board of the input sensing unit.

Although various example embodiments of the present invention have been described, it is understood that the present invention should not be limited to these example embodiments, and that various changes and modifications may be made as would be understood by one having ordinary skill in the art, all without departing from the spirit and scope of the present invention as hereinafter claimed and equivalents thereof.

What is claimed is:

1. An input sensing device comprises:
   an input sensing panel comprising a plurality of sensing electrodes;
   a flexible circuit board connected to a first side of the input sensing panel;
   a first lower protective film below the input sensing panel;
   a second lower protective film below the first lower protective film; and
   a reinforcing member between a lower portion of the flexible circuit board and a second side of the input sensing panel that is adjacent to the first side, the reinforcing member covering a portion of the lower portion of the flexible circuit board,
   wherein a side facing the reinforcing member of any one of the first lower protective film and the second lower protective film is spaced from the reinforcing member.

2. The input sensing device of claim 1, wherein a length of the second lower protective film in a direction parallel to a touch sensing surface of the input sensing panel is shorter than a length of the first lower protective film in the direction, and the side facing the reinforcing member of the second lower protective film is spaced from the reinforcing member.

3. The input sensing device of claim 1, wherein a thickness of the first lower protective film is less than a thickness of the second lower protective film in a direction perpendicular to a touch sensing surface of the input sensing panel.

4. The input sensing device of claim 3, wherein a thickness of the reinforcing member at the second side of the input sensing panel corresponds to a sum of a thickness of the flexible circuit board and the thickness of the first lower protective film.

5. The input sensing device of claim 4, wherein a maximum thickness of the reinforcing member in the direction is 90 μm or less.

6. The input sensing device of claim 4, wherein the thickness of the reinforcing member decreases as a distance from the second side of the input sensing panel increases.

7. The input sensing device of claim 1, wherein each of the first lower protective film and the second lower protective film comprises a peelable film.

8. The input sensing device of claim 1, wherein the first lower protective film comprises a pull tab extending from a side of the first lower protective film.

9. The input sensing device of claim 1, wherein a thickness of the first lower protective film is greater than a thickness of the second lower protective film in a direction perpendicular to a touch sensing surface of the input sensing panel.

10. The input sensing device of claim 1, wherein a length of the first lower protective film in a direction parallel to a touch sensing surface of the input sensing panel is shorter than a length of the second lower protective film in the direction, and the side facing the reinforcing member of the first lower protective film is spaced from the reinforcing member.

11. The input sensing device of claim 10, wherein the reinforcing member at the second side of the input sensing panel comprises a portion that is between the input sensing panel and the second lower protective film to overlap with a portion of the second lower protective film.

12. The input sensing device of claim 1, further comprising an upper protective film on the input sensing panel.

13. A display device comprising:
    a display panel comprising a plurality of pixels;
    a protective member on the display panel;
    an input sensing panel on an upper surface of the display panel and comprising a plurality of sensing electrodes;
    an adhesive member between the display panel and the input sensing panel, the adhesive member connecting the input sensing panel to the display panel;
    a flexible circuit board connected to a first side of the input sensing panel; and
    a reinforcing member between a lower portion of the flexible circuit board and a second side of the input sensing panel that is adjacent to the first side, the reinforcing member covering a portion of the lower portion of the flexible circuit board,
    wherein the reinforcing member is spaced from the protective member.

14. The display device of claim 13, wherein the reinforcing member is further located at one side of the adhesive member that is adjacent to the second side of the input sensing panel.

15. The display device of claim 13, wherein a thickness of the reinforcing member decreases as a distance from the second side of the input sensing panel increases.

16. The display device of claim 13, wherein one side of the reinforcing member is between the input sensing panel and the adhesive member to cover a lower end of the second side of the input sensing panel.

17. The display device of claim 13, further comprising:
    a main circuit board; and
    a panel flexible circuit board connected to one side of the display panel, the panel flexible circuit board electrically connecting the main circuit board to the display panel,
    wherein the flexible circuit board is electrically connected to the main circuit board.

18. A method for manufacturing an input sensing device, the method comprising:
    connecting a flexible circuit board to a first side of an input sensing panel comprising a plurality of sensing electrodes;
    placing a first lower protective film below the input sensing panel, and a second lower protective film below the first lower protective film; and
    placing a reinforcing member between a lower portion of the flexible circuit board and a second side of the input sensing panel that is adjacent to the first side, the reinforcing member covering a portion of the lower portion of the flexible circuit board,
    wherein a side facing the reinforcing member of any one of the first lower protective film and the second lower protective film is spaced from the reinforcing member.

19. The method of claim 18, wherein a length of the second lower protective film in a second direction is shorter than a length of the first lower protective film in the second direction, and the side facing the reinforcing member of the second lower protective film is spaced from the reinforcing member.

20. The method of claim 18, wherein a thickness of the first lower protective film is less than a thickness of the second lower protective film in a direction perpendicular to a surface of the input sensing panel.

* * * * *